US012218163B2

(12) United States Patent
Fourel et al.

(10) Patent No.: US 12,218,163 B2
(45) Date of Patent: Feb. 4, 2025

(54) IMAGE ACQUISITION DEVICE

(71) Applicant: STMicroelectronics (Crolles 2) SAS, Crolles (FR)

(72) Inventors: Mickael Fourel, Champagnier (FR); Laurent-Luc Chapelon, Domene (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 18/591,950

(22) Filed: Feb. 29, 2024

(65) Prior Publication Data
US 2024/0204017 A1 Jun. 20, 2024

Related U.S. Application Data

(62) Division of application No. 17/224,720, filed on Apr. 7, 2021, now Pat. No. 11,948,950.

(30) Foreign Application Priority Data

Apr. 15, 2020 (FR) ........................................ 2003759

(51) Int. Cl.
*H01L 27/146* (2006.01)
*G02B 1/10* (2015.01)
*G02B 1/14* (2015.01)
*G02B 3/00* (2006.01)

(52) U.S. Cl.
CPC .......... *H01L 27/14621* (2013.01); *G02B 1/10* (2013.01); *G02B 1/14* (2015.01); *G02B 3/0012* (2013.01); *H01L 27/14618* (2013.01); *H01L 27/14627* (2013.01); *H01L 27/14685* (2013.01)

(58) Field of Classification Search
CPC ......... H01L 27/14621; H01L 27/14618; H01L 27/14627; H01L 27/14685; H01L 27/1462; H01L 27/14645; H01L 27/14623; G02B 1/10; G02B 1/14; G02B 3/0012
See application file for complete search history.

(56) References Cited

U.S. PATENT DOCUMENTS

| | | | |
|---|---|---|---|
| 7,075,164 B2 | 7/2006 | Uya | |
| 8,003,425 B2* | 8/2011 | Adkisson | ......... H01L 27/14618 438/62 |
| 9,985,062 B2* | 5/2018 | Jung | ................. H01L 27/14645 |
| 2006/0220025 A1* | 10/2006 | Oh | ..................... H01L 27/14636 257/E27.134 |
| 2010/0289101 A1* | 11/2010 | Vaillant | ............. H01L 27/14685 257/E31.127 |
| 2011/0241152 A1 | 10/2011 | Hsiao et al. | |
| 2015/0228689 A1 | 8/2015 | Lenchenkov | |
| 2019/0229141 A1 | 7/2019 | Kim et al. | |
| 2020/0098808 A1 | 3/2020 | Wu et al. | |
| 2020/0119072 A1 | 4/2020 | Lim | |

FOREIGN PATENT DOCUMENTS

WO 2015111419 A3 7/2015

OTHER PUBLICATIONS

INPI Search Report and Written Opinion for priority application, FR 2003759 dated Dec. 21, 2020 (8 pages).

\* cited by examiner

*Primary Examiner* — Jonathan Han
(74) *Attorney, Agent, or Firm* — Crowe & Dunlevy LLC

(57) ABSTRACT

An image acquisition device includes an array of color filters and an array of microlenses over the array of color filters. At least one layer made from an inorganic dielectric material is formed between the array of color filters and the array of microlenses.

19 Claims, 4 Drawing Sheets

IMAGE ACQUISITION DEVICE

CROSS REFERENCE TO RELATED APPLICATIONS

This application is a divisional of United States Application for patent Ser. No. 17/224,720, filed Apr. 7, 2021, which claims the priority benefit of French Application for Patent No. 2003759, filed on Apr. 15, 2020, the contents of which are hereby incorporated by reference in their entireties to the maximum extent allowable by law.

TECHNICAL FIELD

The present disclosure relates generally to an image acquisition device.

More specifically, the present disclosure relates to an image acquisition device comprising an array of inorganic photodetectors covered by an array of organic color filters and an array of microlenses.

BACKGROUND

In order to guarantee the reliability of electronic components, the electronic components must respect criteria of temperature, pressure, humidity, etc. resistance. However, many image acquisition devices comprising an array of inorganic photodetectors covered by an array of organic color filters and an array of microlenses experience a degradation of their performance when they are subject to temperature and moisture resistance tests and therefore do not succeed in respecting the temperature and moisture resistance criteria.

There is accordingly a need in the art to improve the image acquisition devices by addressing all or some of the drawbacks of known image acquisition devices.

SUMMARY

One embodiment provides an image acquisition device comprising at least one layer made from an inorganic dielectric material between an array of color filters and an array of microlenses.

According to one embodiment, the layer is made up of silicon nitride and/or metal nitrides.

According to one embodiment, the layer is made up of silicon oxide and/or silicon oxynitride and/or metal oxides.

According to one embodiment, the layer is made up of silicon nitride.

According to one embodiment, the layer extends over the entire interface between the array of color filters and the array of microlenses.

According to one embodiment, said layer has a thickness inclusively between 30 nm and 200 nm, preferably inclusively between 40 nm and 130 nm.

According to one embodiment, each microlens of the array covers a single color filter of the array and each color filter of the array is covered by a single microlens of the array.

According to one embodiment, the color filters of the array and the microlenses of the array are made from organic materials.

According to one embodiment, the array of microlenses is covered by a protective layer.

One embodiment provides a method for producing an image acquisition device as described, comprising a step for depositing said layer by plasma-enhanced chemical vapor deposition.

According to one embodiment, said deposition of said layer is done on the surface of the color filter array.

According to one embodiment, the step for deposition of said layer is done at a temperature below 250° C., preferably less than or equal to 200° C.

According to one embodiment, the step for deposition of said layer is preceded by a step for formation of the color filter array.

According to one embodiment, the step for deposition of said layer is followed by a step for formation of the array of microlenses on the surface of said layer.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Figure 1:
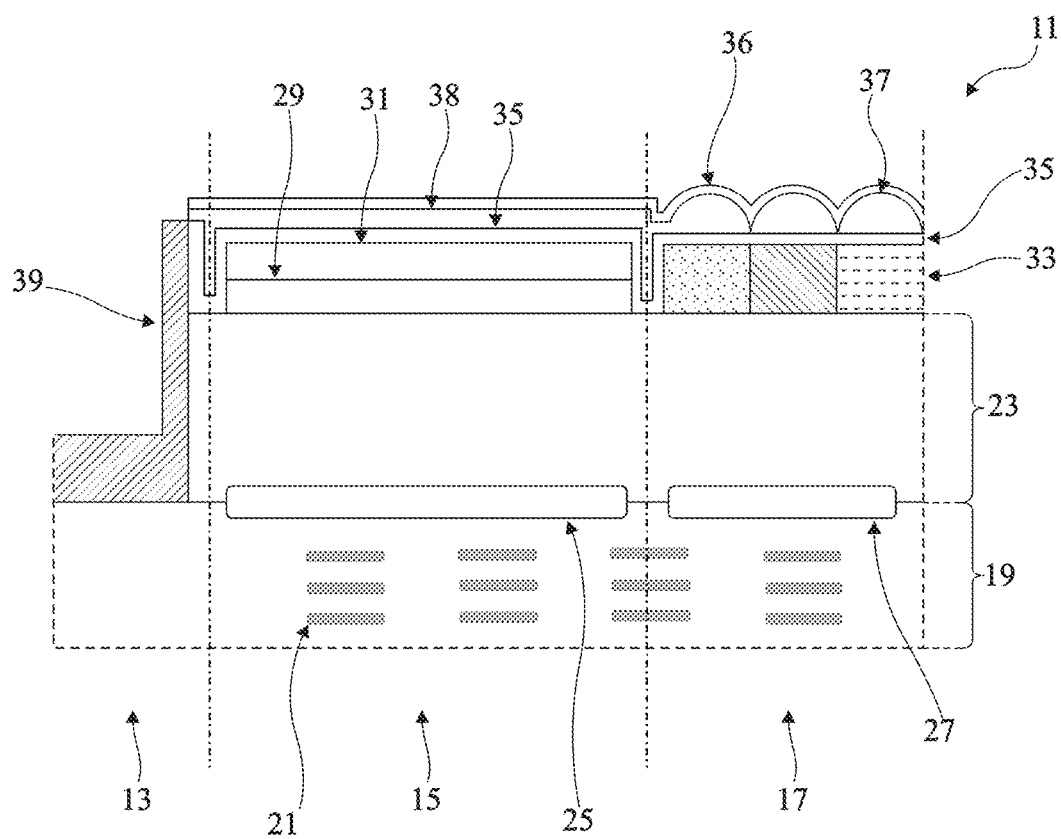
FIG. 1 shows, in partial and schematic sectional view, one embodiment of an image acquisition device.

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the embodiment of the sensors has not been described in detail, the disclosed embodiments being compatible with the usual embodiments of the sensors.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially", "practically" and "in the order of" signify within 10%, and preferably within 5%. Furthermore, it is considered here that the terms "insulating" and "conductive" respectively mean "electrically insulating" and "electrically conductive".

Unless otherwise specified, the expressions "the set of elements", "all of the elements" and "each element" mean between 95% and 100% of the elements. Unless otherwise specified, the expression "it comprises only the elements"

means that it comprises at least 90% of the elements, preferably that it comprises at least 95% of the elements.

In the remainder of the disclosure, unless otherwise specified, a layer or a film is said to be opaque to a ray when the transmittance of the ray through the layer or the film is less than 10%. In the remainder of the disclosure, a layer or a film is said to be transparent to a ray when the transmittance of the ray through the layer or the film is greater than 10%.

Embodiments of optical systems will now be described for optical systems comprising an array of optical elements of micrometric size in the case where each optical element of micrometric size corresponds to a lens of micrometric size, or microlens, made up of two diopters. However, it is clear that these embodiments can also be implemented with other types of optical elements of micrometric size, each optical element of micrometric size being able to correspond, for example, to a micrometric Fresnel lens, a micrometric gradient index lens or a micrometric diffraction grating.

In the remainder of the disclosure, visible light refers to an electromagnetic ray having a wavelength inclusively between 400 nm and 700 nm. In this range, red light refers to an electromagnetic ray whose wavelength is inclusively between 600 nm and 700 nm, blue light refers to an electromagnetic ray whose wavelength is inclusively between 450 nm and 500 nm and green light refers to an electromagnetic ray whose wavelength is inclusively between 500 nm and 600 nm.

FIG. 1 shows, in partial and schematic sectional view, one embodiment of an image acquisition device 11.

According to the embodiment illustrated in FIG. 1, the image acquisition device 11 comprises three laterally separate parts, in the orientation of the figure: a connecting part 13, shown on the left in FIG. 1; a logic part 15, shown in the center of FIG. 1; and a sensor part 17, shown on the right in FIG. 1.

According to the embodiment illustrated in FIG. 1, the three parts 13, 15 and 17 include a stack 19 of insulating layers, conductive tracks with different levels of metallization 21 between the insulating layers and conductive vias (not shown) connecting the tracks with different levels of metallization. The stack 19 preferably has a thickness in the order of 2 μm.

The device 11 preferably comprises a layer 23, or substrate, covering the stack 19 and extending over practically all of the upper face of the stack 19 in the logic part 15 and the sensor part 17. The substrate 23 is preferably made from a semiconductor material, for example from silicon. The substrate 23, for example, comprises insulating trenches (not shown) making it possible to insulate portions of the substrate 23 from one another, in particular in the sensor part 17. The substrate 23, for example, has a thickness in the order of 3 μm.

The device 11 further comprises electronic components, formed in the substrate 23 and/or on the face of the substrate 23 located on the side of the stack 19, these electronic components being symbolized by rectangles 25 and 27 in FIG. 1. As an example, in the logic part 15, the components 25 comprise insulated gate field effect transistors, or MOS (Metal Oxide Semiconductor) transistors, in particular made using CMOS (Complementary Metal Oxide Semiconductor) technology and, in the sensor part 17, the components 27 comprise photodetectors.

According to one embodiment, the device 11 comprises a conductive layer 29 extending so as to cover the surface of the substrate 23 in the logic part 15. The layer 29 is, for example, opaque at the wavelengths of the application in question. The layer 29 is, for example, made from tungsten and has a thickness in the order of 200 μm.

According to the embodiment illustrated in FIG. 1, the device 11 comprises a layer 31 covering the layer 29. More specifically, the layer 31 is located in the logic part 15 of the device 11 and extends over the entire upper face of the layer 29. The layer 31 is preferably made from an organic material (for example, a resin) only allowing radiation to pass at the desired wavelengths. The layer 31 can be made in a single layer or a stack of several layers made from different materials, which makes it possible, for example, to reduce stray reflections. The layer 31, for example, has a thickness in the order of 500 nm to 1000 nm.

The image acquisition device 11 further comprises a color filter array 33. The color filter array 33 is located in the sensor part 17 of the device 11 on the upper face of the substrate 23.

The color filter array 33 is made up of different resins, for example organic, so as to filter the incident rays while locally allowing only the red radiation, blue radiation or green radiation to pass.

The color filter array 33 thus comprises first color filters made up of a first resin, referred to as the red resin, allowing only the red radiation to pass, second color filters made up of a second resin, referred to as the blue resin, allowing only the blue radiation to pass and third color filters made up of a third resin, referred to as the green resin, allowing only the green radiation to pass. These color filters are organized in the form of blocks of resin substantially of the same size. The blocks of resin have, for example, a substantially square shape as seen in a direction perpendicular to the upper face of the substrate 23. The characteristic dimension of the blocks is, for example, in the order of 600 nm to 900 nm. The blocks of resin are preferably organized in matrix form, as seen in a direction perpendicular to the upper face of the substrate 23, in rows and columns, for example, according to a Bayer matrix. Thus, the blocks of resin are, for example, organized such that about 50% of the matrix is made up of blocks of green resin. The matrix is additionally made up of about 25% blocks of red resin and about 25% blocks of blue resin. The matrix, for example, has a thickness inclusively between 600 nm and 900 nm.

The device 11 also comprises an insulating layer 35 covering the entire upper face of the array of color filters 33. The layer 35 further preferably covers the upper face of the layer 31 and covers the surfaces of the layer 29 in locations where the layer 29 is not covered by the layer 31. The layer 35 can further cover the substrate 23 in locations where the substrate 23 is not covered by the layer 29 in the logic part 15 of the matrix 33 in the sensor part 17.

The insulating layer 35 is made up of an inorganic material. According to one embodiment, the material making up the layer 35 is one or more of a silicon nitride ($Si_3N_4$) and/or a metal nitride. In a variant, the material making up the layer 35 is one or more of a silicon oxide ($SiO_2$) and/or a silicon oxynitride (SiON) and/or a metal oxide. The material making up the layer 35 can, according to another variant, be a combination of several metal nitrides, a combination of several metal oxides or a combination of silicon nitride and/or silicon oxide and/or silicon oxynitride and/or one or several metal nitrides and/or one or several metal oxides. The layer 35 can have a single-layer structure or a multi-layer structure.

As an example, the metal nitrides are chosen from a group of materials including titanium nitride (TiN) and tantalum nitride (TaN). Still as an example, the metal oxides are chosen from a group of materials including manganese monoxide (MnO), titanium dioxide ($TiO_2$), alumina ($Al_2O_3$), zinc oxide (ZnO), cobalt monoxide (CoO), indium tin oxide (ITO), Aluminum-doped Zinc Oxide (AZO) and molybdenum oxide (MoO).

The layer 35 is, for example, made from a group of materials including silicon nitride, silicon dioxide coupled with alumina, silicon oxynitride, silicon oxynitride coupled with alumina or from alumina. The layer 35 is preferably made from silicon nitride.

The layer 35, for example, has a thickness inclusively between 30 nm and 200 nm, preferably inclusively between 40 nm and 130 nm, more preferably equal to about 40 nm. The thickness of the layer 35 is configured so that the layer 35 is transparent in the visible domain (spectrum).

The device 11 comprises an array of lenses 37, of micrometric size, for example, planar convex lenses covering the layer 35 in the sensor part 17. The planar face of the microlenses 37 preferably rests on the upper face of the layer 35 and in contact with the layer 35.

According to one embodiment, the microlenses 37 are located aligned with the color filter array 33. The array of microlenses 37 is preferably arranged in the same matrix form as the color filter array 33, the optical axis of each microlens 37 being combined with the center of a resin block. Each microlens 37 preferably covers a single resin block of the color filter array 33 and each resin block is covered by a single microlens 37. The microlenses 37 can have a diameter substantially equal to the size of the sides of the resin blocks of the color filter array 33.

The microlenses 37 are, for example, made up of an organic resin. The microlenses 37 are preferably transparent in the considered wavelengths. The microlenses 37 are more preferably transparent in the visible domain.

According to the embodiment illustrated in FIG. 1, the microlenses 37 are all the same, that is to say, they have the same chemical composition and the same dimensions.

In a variant, the microlenses 37 may not all have the same dimensions.

Preferably, the component material used to make the microlenses 37 extends in the logic part on the upper face of the layer 35 so as to form a layer 38 which covers the layer 35.

The device 11 may further comprise a protective layer 36 covering the layer 38 and the lenses 37 and in contact with the microlenses 37. The protective layer 36 can be made from an inorganic material, for example one of the materials previously described for the layer 35.

According to one embodiment, the protective layer 36 is substantially tight with respect to moisture. The protective layer 36, for example, has a thickness inclusively between 100 nm and 600 nm.

According to the embodiment illustrated in FIG. 1, the device 11 comprises a connecting pad 39, partially shown in FIG. 1. The connecting pad 39 is, for example, located in the connecting part 13 of the device. The pad 39 is preferably, seen in a direction parallel to the upper face of the substrate 23, U-shaped, the lower face being flush with the lower face of the substrate 23. The side edges of the pad 39 extend vertically, from the lower face of the substrate 23 along the substrate 23 and the layer 35, past the upper face of the layer 35. The pad 39 is not covered by the layers 35 and 36. The edges and the bottom of the pad 39 are, for example, made from a metal material, preferably from aluminum.

FIGS. 2 to 6 are partial and schematic sectional views of structures obtained in successive steps of one embodiment of a method for manufacturing the device shown in FIG. 1.

Figure 2:
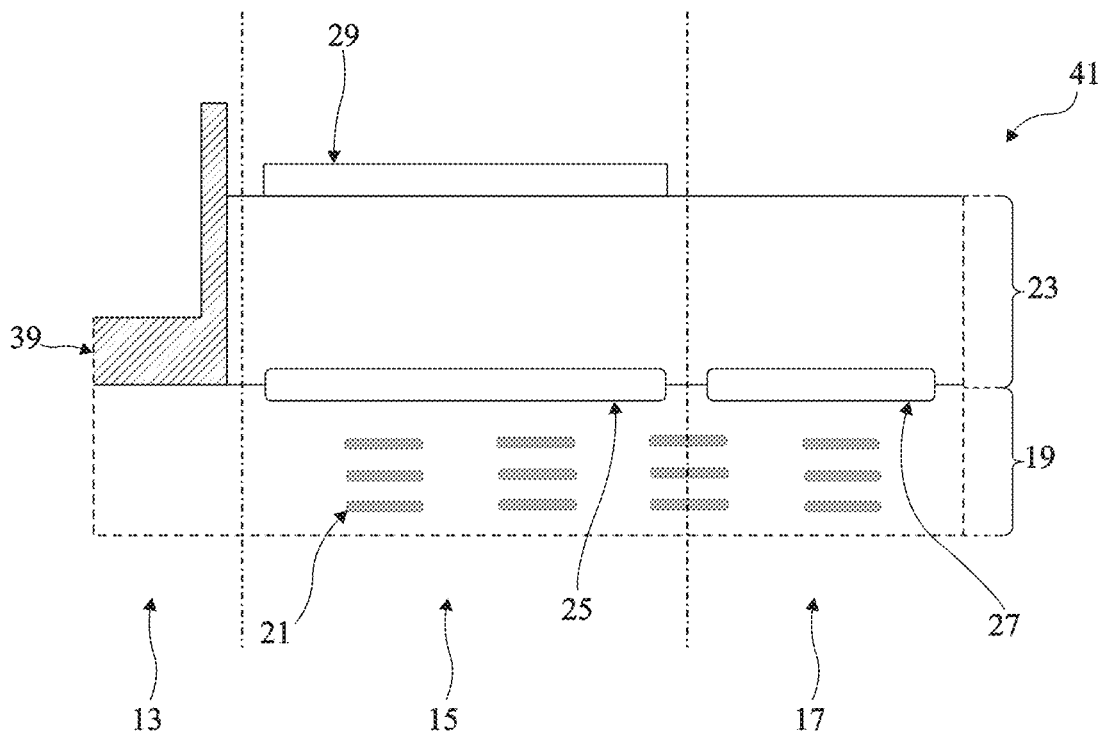
FIG. 2 shows one step of a method for manufacturing the device illustrated in FIG. 1.

FIG. 2 illustrates the structure 41 obtained after the formation of the components 25 and 27, the formation of the stack 19 on the substrate 23, the formation of the layer 29 and the formation of the connecting pad 39.

Figure 3:
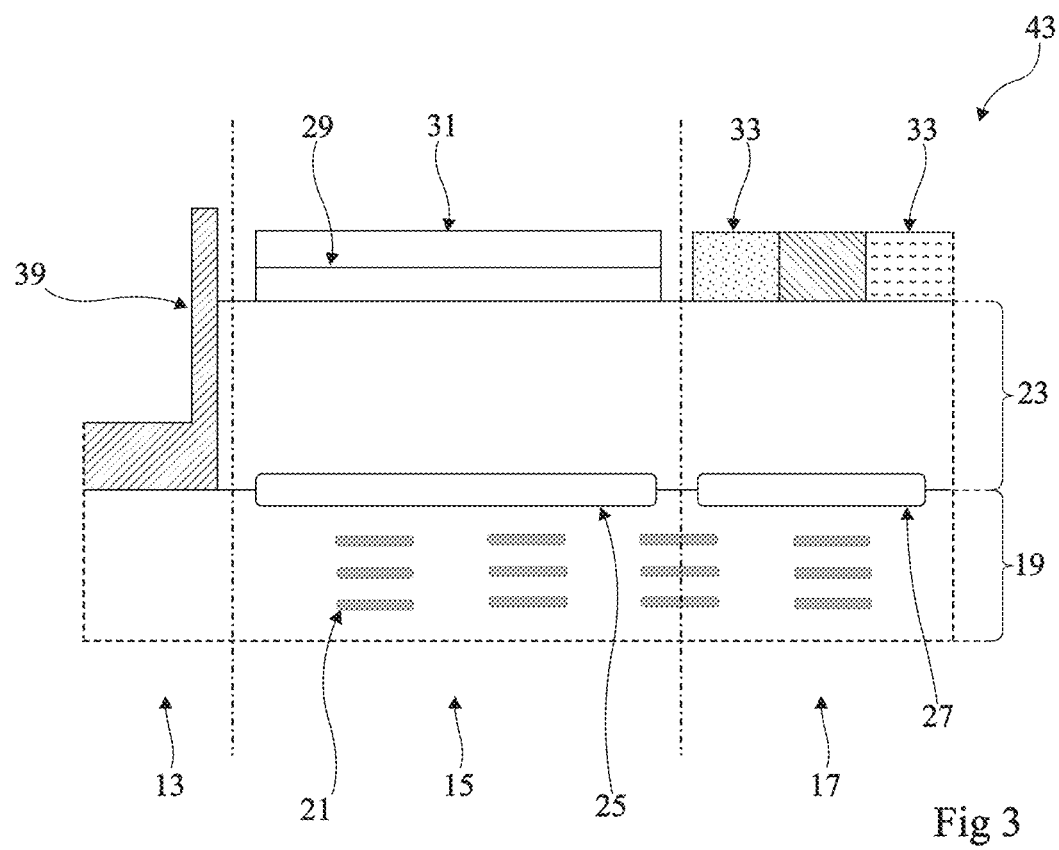
FIG. 3 illustrates another step of the method.

FIG. 3 illustrates the structure 43 obtained after the formation of the color filter array 33 on the upper face of the structure 41 illustrated in FIG. 2 and the formation of the layer 31.

The formation of the color filter array 33 is preferably done in three successive steps consisting, in a first step, of forming the blocks of green resin, in a second step, forming the blocks of blue resin and the layer 31, then in a third step, forming the blocks of red resin.

It is understood that the order of these steps can be modified so as, for example, to form the blocks of red resin before the blocks of blue resin.

As an example, the step for forming the blocks of green resin consists of depositing a layer of the green resin on the entire structure 41 as illustrated in FIG. 2 followed by a partial removal of this same layer of resin in order to keep it only in the desired locations.

The deposition of the layer of green resin is, for example, done by deposition by centrifugation, also called spin-coating. The deposition is done on the full plate such that the entire upper face of the structure 41 is covered by the layer of green resin.

According to one embodiment, the localized removal of the layer of green resin is done by photolithography. In other words, the layer of green resin can, for example, be full-plate covered by a layer of photoresist that is partially removed by photolithography such that the photoresist only covers the future blocks of green resin. The structure thus obtained next undergoes etching so as to remove the parts of the layer of green resin, not topped by the photoresist, and to remove the photoresist.

In a variant, if the green resin is photosensitive, the partial removal of the green resin can be done directly through photolithography steps with no prior deposition of a photoresist.

The different steps to form blocks of red and blue resin can be identical to the steps for forming blocks of green resin previously described.

Figure 4:
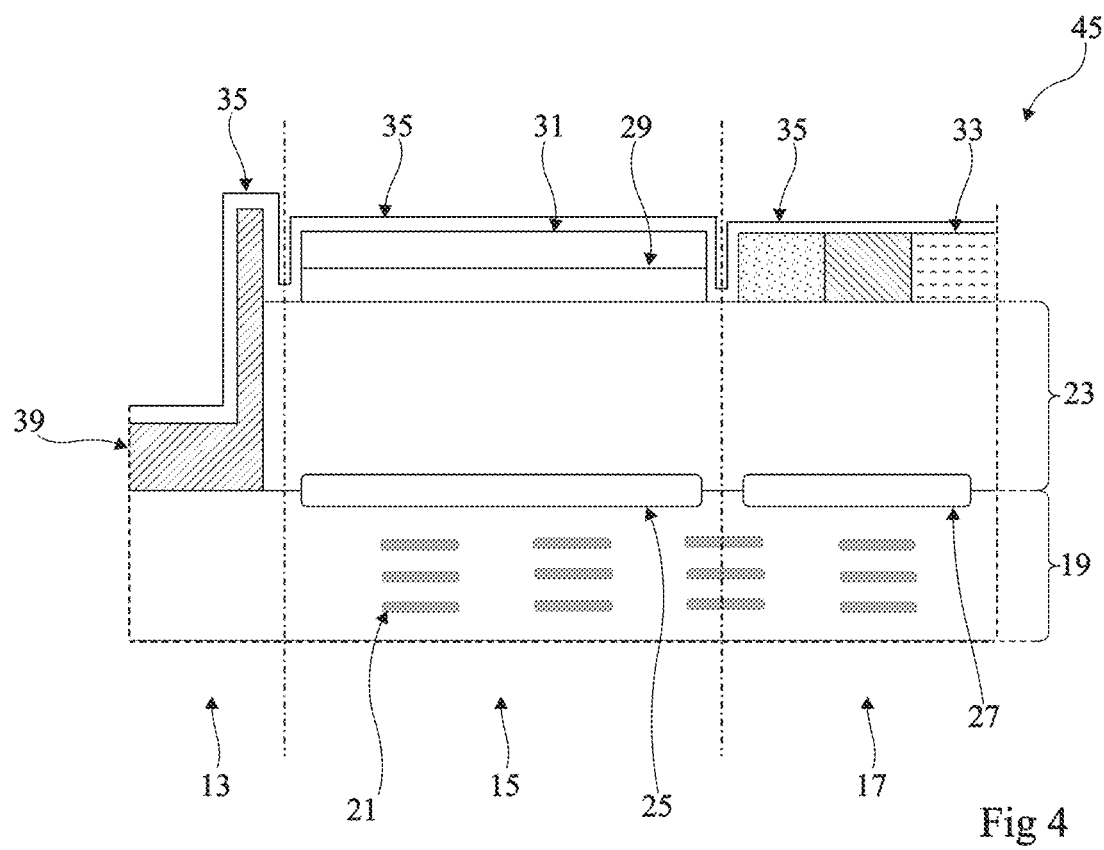
FIG. 4 illustrates another step of the method.

FIG. 4 illustrates the structure 45 obtained after a step for depositing the insulating layer 35 on the upper face of the structure 43 illustrated in FIG. 3.

According to one preferred embodiment, the step for depositing the layer 35 is done by plasma-enhanced chemical vapor deposition (PECVD). The layer 35 is, for example, deposited from a plasma formed by silane, ammonia and nitrogen. As an example, the silicon oxide is deposited from a plasma formed by tetraethyl orthosilicate (TEOS), oxygen and helium. Still as an example, the silicon nitride is deposited from a plasma formed by silane, ammonia and nitrogen.

In a variant, the step for depositing the layer 35 is done using any other chemical vapor deposition (CVD) technique, such as low-pressure chemical vapor deposition (LPCVD). The step for depositing the layer 35 can also be done through a physical vapor deposition (PVD) technique or an atomic layer deposition (ALD) technique.

The deposition of the layer 35 is preferably done at a temperature below 250° C., more preferably less than or equal to 200° C. Still more preferably, the deposition is done at a temperature in the order of 200° C.

The layer 35 is formed by solid (integral) plate, that is to say that the layer 35 is formed over the entire upper face of the structure 43 illustrated in FIG. 3, including over the upper face of the connecting pad 39.

The layer 35 preferably has a thickness inclusively between 30 nm and 200 nm, for example inclusively between 40 nm and 130 nm.

Figure 5:
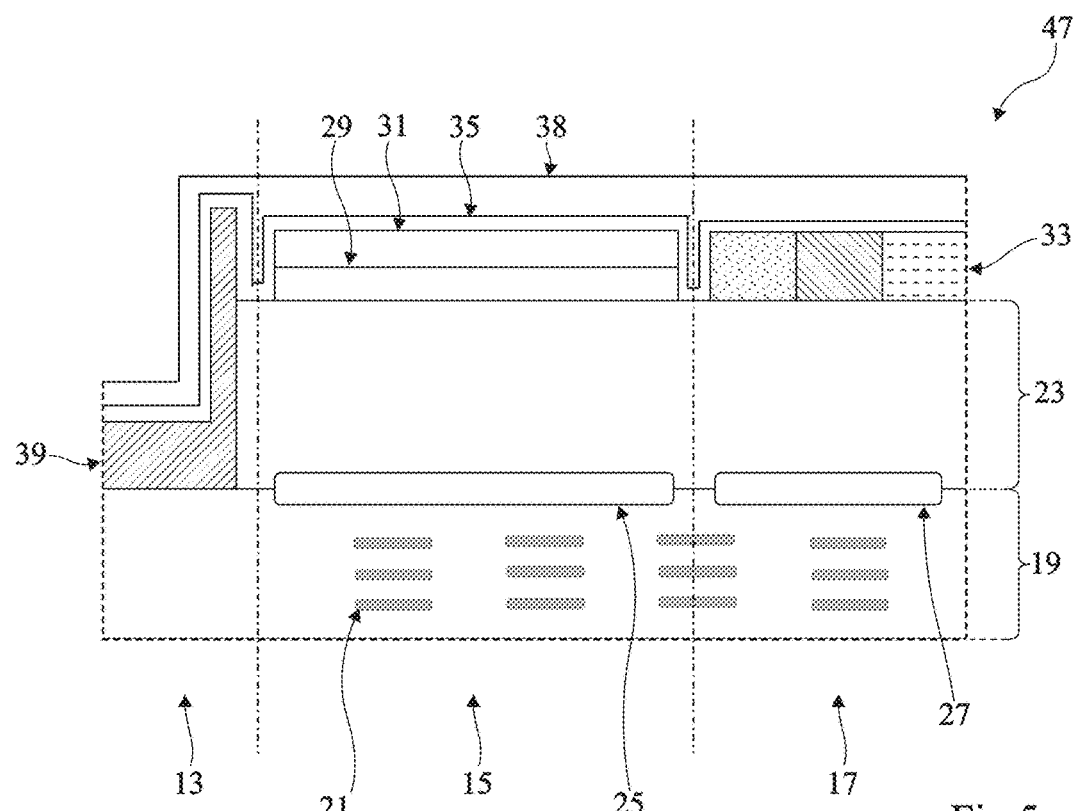
FIG. 5 illustrates another step of the method.

FIG. 5 illustrates the structure 47 obtained after a step for depositing the layer 38 of a resin making up the microlenses 37 on the upper face of the structure 45 illustrated in FIG. 4.

The deposition of the layer 38 is preferably done by centrifugation such that the layer 38 covers the entire upper face of the structure 45 illustrated in FIG. 4. In other words, the upper face of the layer 35 is covered by the layer 38.

Figure 6:
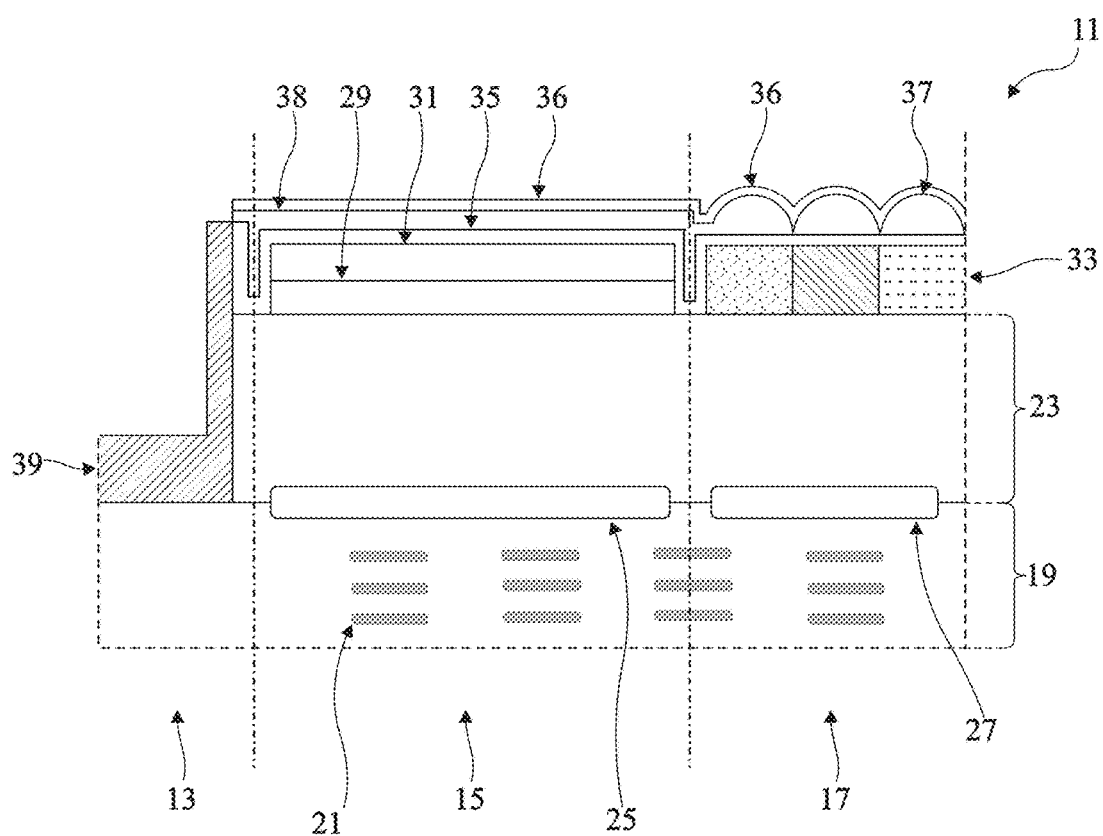
FIG. 6 illustrates another step of the method.

FIG. 6 illustrates the structure 11 obtained after a step for forming the lenses 37, forming the layer 36 and partially removing the layer 35.

According to one embodiment, the step for forming the microlenses 37 comprises a photolithography step followed by an annealing or heating. The microlenses 37 are thus shaped in the layer 38 shown in the structure 47 of FIG. 5.

According to one embodiment, the protective layer 36 is deposited, by a PECVD method, on the upper face of the structure obtained at the end of the formation of the lenses 37. The protective layer 36 can, for example, cover the layer 38 and the microlenses 37 by surrounding them.

According to one embodiment, an etching step is carried out so as to remove the parts of the layers 35, 36 and 38 covering the connecting pad 39.

The layers 36, 35 and 38 are, for example, removed outside the sensor 17 and logic 15 parts by photolithography.

Figure 7A:
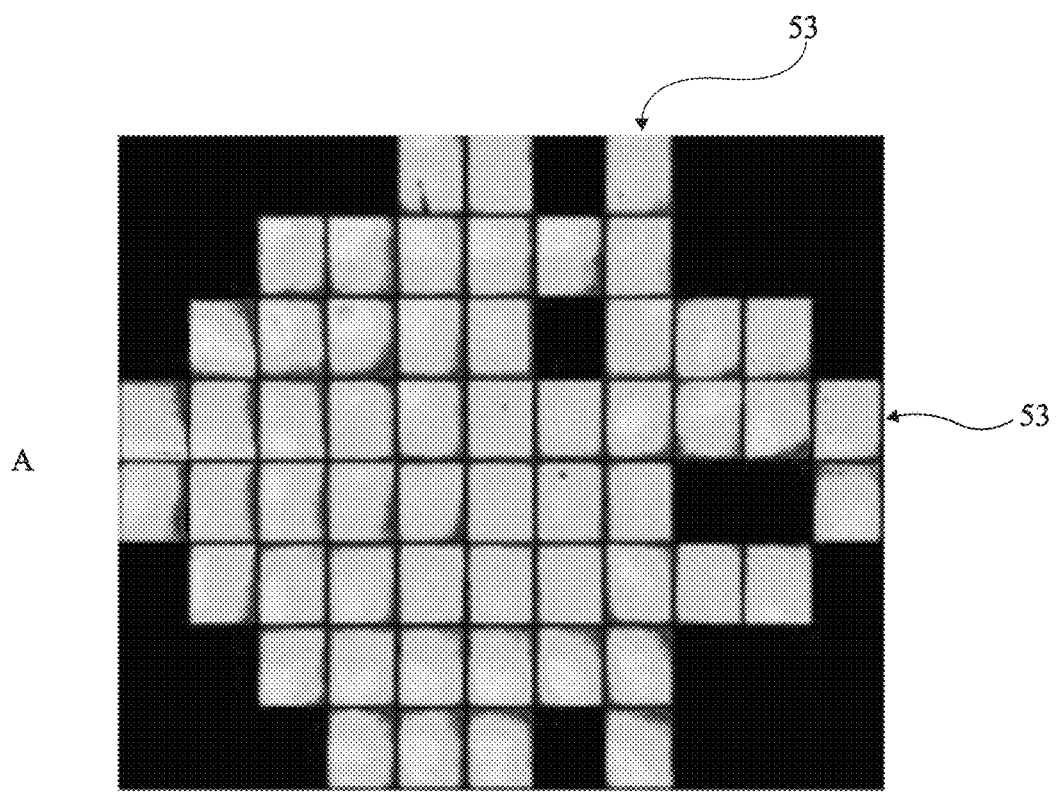
FIGS. 7A and 7B illustrate two examples of images captured by two different sets of image acquisition devices.
Figure 7B:
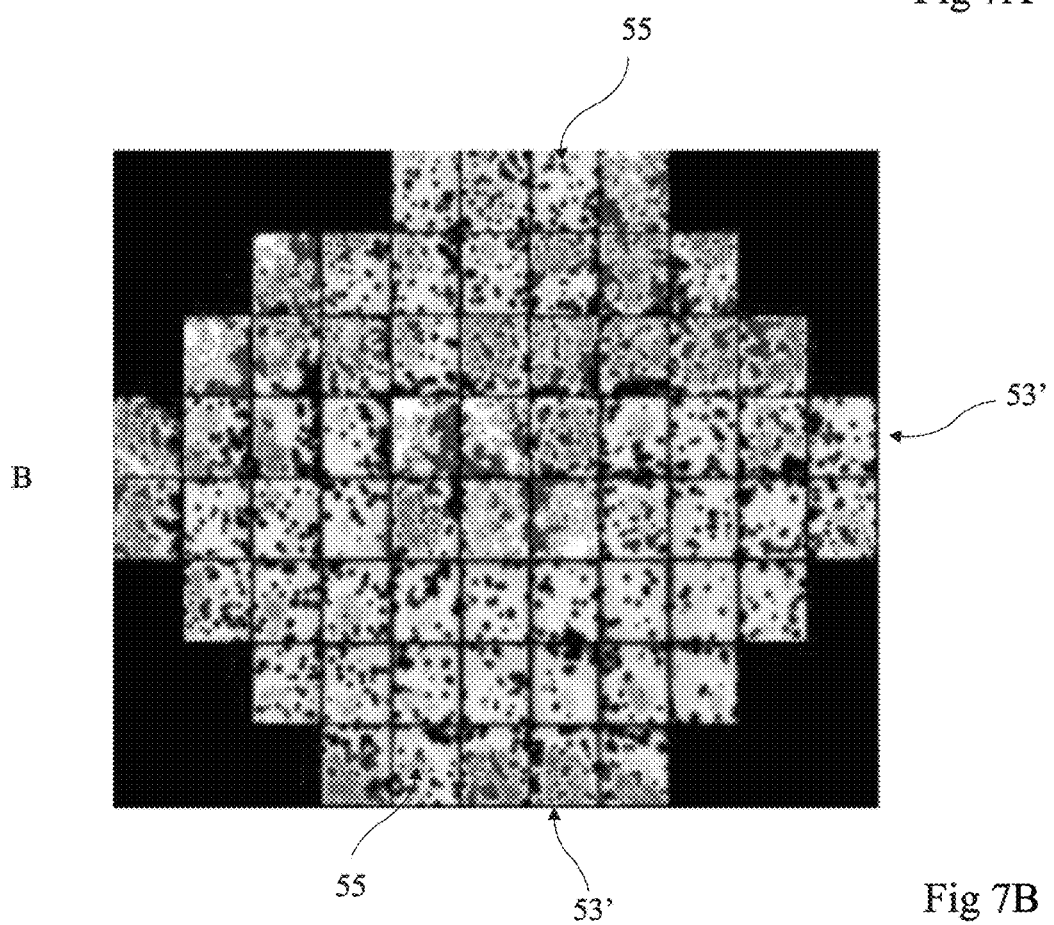

FIGS. 7A and 7B illustrate two examples 53 and 53' of images captured by two different sets of image acquisition devices.

In order to show the improvement in performance resulting from the presence of the layer 35 within an image acquisition device, the inventors have conducted comparative tests of temperature and humidity resistance on a first set of image acquisition devices and a second set of image acquisition devices.

The image acquisition devices of the second set of devices have the same structure as the devices of the first set of devices, with the exception that they do not comprise a layer 35 between the color filter array 33 and the microlenses 37.

In order to test the resistance to heat and humidity, the two aforementioned sets of devices have undergone highly accelerated stress tests (HAST) commonly used in order to test electronic circuits. The HAST test consists of exposing the devices to a temperature in the order of 130° C. and to a relative humidity percentage of 85% for 96 hours in a chamber in which the pressure is of two atmospheres. At the end of 96 hours, the two sets of devices are illuminated with a ray in particular comprising blue, green and red components, and the captured images are analyzed.

FIG. 7A shows the images 53 captured by the devices 11 of the first set which comprise the layer 35.

FIG. 7B shows the images 53' captured by the devices of the second set which do not comprise the layer 35.

In FIGS. 7A and 7B, each acquired image 53 and 53' is, for example, substantially rectangular and comprises about 500 pixels by 750 pixels.

While the structure of the devices of the first and second sets making it possible to acquire the images 53 and 53' illustrated in FIGS. 7A and 7B only differ by the presence of the layer 35, the images 53' shown in FIG. 7B are dotted with black points 55. These black points 55 represent local losses of sensitivity, for example inclusively between 2% and 10%. These black points 55 have a size, for example, in the order of several tens of micrometers.

The inventors have shown that, under the effect of the heat, significant mechanical stresses appear in the image acquisition device, in particular due to the differences in thermal expansion coefficients of the organic materials making up the microlenses and color filters and relative to most of the inorganic materials of the image acquisition device. Indeed, the expansion coefficients of the materials making up the microlenses and the color filters can be high, in particular between 120 ppm/° C. and 400 ppm/° C. while most of the other materials of the device can have a low expansion coefficient, for example in the order for example of 1 ppm/° C.

The mechanical stresses can cause the cracking of the protective layer 36 and a penetration of humidity in the lower layers, for example in the microlenses 37 and in the color filters 33. The humidity having infiltrated the device 11 causes localized decreases in sensitivity of several percent, as observed in FIG. 7B. In the presence of the layer 35, no localized decrease in sensitivity is observed for the image acquisition devices.

One advantage of the described embodiments and modes of implementation is that they make it possible to improve the temperature and humidity resistance of the image acquisition devices.

Various embodiments and variants have been described. Those skilled in the art will understand that certain features of these embodiments can be combined and other variants will readily occur to those skilled in the art. In particular, the embodiments and modes of implementation can be combined. The described embodiments are not limited to the exemplary sizes and materials mentioned hereinabove.

Finally, the practical implementation of the embodiments and variants described herein is within the capabilities of those skilled in the art based on the functional description provided hereinabove.

The invention claimed is:

1. A method for producing an image acquisition device, comprising:
   forming an array of visible light color filters;
   depositing at least one layer made from an inorganic dielectric material by plasma-enhanced chemical vapor deposition on the array of visible light color filters; and
   forming an array of microlenses on the at least one layer made from an inorganic dielectric material and extending over the array of visible light color filters;
   wherein depositing comprises using a metal nitride for the inorganic dielectric material.

2. The method according to claim 1, wherein depositing comprises depositing on a surface of the array of visible color filters.

3. The method according to claim 1, wherein depositing comprises depositing at a temperature below 250° C.

4. The method according to claim 1, wherein depositing comprises depositing at a temperature less than or equal to 200° C.

5. The method according to claim 1, wherein the metal nitride is titanium nitride (TiN).

6. The method according to claim 1, wherein the metal nitride is tantalum nitride (TaN).

7. A method for producing an image acquisition device, comprising:
   forming an array of visible light color filters;
   depositing at least one layer made from an inorganic dielectric material by plasma-enhanced chemical vapor deposition on the array of visible light color filters; and forming an array of microlenses on the at least one layer made from an inorganic dielectric material and extending over the array of visible light color filters;

wherein depositing comprises using a silicon oxynitride for the inorganic dielectric material.

8. The method according to claim 7, wherein depositing comprises depositing on a surface of the array of visible color filters.

9. The method according to claim 7, wherein depositing comprises depositing at a temperature below 250° C.

10. The method according to claim 7, wherein depositing comprises depositing at a temperature less than or equal to 200° C.

11. A method of producing an image acquisition device, comprising:

forming a first region with digital circuits and a second region with photodetection circuits in a semiconductor substrate, said semiconductor substrate including a back surface;

depositing an opaque conductive layer on the back surface at the first region;

forming a matrix of visible light color filters on the back surface at the second region;

covering the opaque conductive layer at the first region with an organic material layer;

covering the matrix of color filters at the second region and the organic material layer at the first region with at least one layer made from an inorganic dielectric material deposited by plasma-enhanced chemical vapor deposition;

covering the at least one layer made from the inorganic dielectric material at both the first and second regions with a transparent material layer; and shaping said transparent material layer shaped to form microlenses at the second region positioned over the matrix of visible light color filters.

12. The method according to claim 11, wherein the at least one layer made from the inorganic dielectric material further covers side edges of the opaque conductive layer and the organic material layer in the first region.

13. The method according to claim 11, further comprising forming a protective layer extending over at least the microlenses.

14. The method according to claim 13, wherein said protective layer further extends over the transparent material layer at the first region.

15. The method according to claim 11, wherein the at least one layer made from the inorganic dielectric material is made of a material comprising a silicon nitride.

16. The method according to claim 11, wherein the at least one layer made from the inorganic dielectric material is made of a material comprising a metal nitride.

17. The method according to claim 11, wherein the at least one layer made from the inorganic dielectric material is made of a material comprising a silicon oxide.

18. The method according to claim 11, wherein the at least one layer made from the inorganic dielectric material is made of a material comprising a silicon oxynitride.

19. The method according to claim 11, wherein the at least one layer made from the inorganic dielectric material is made of a material comprising a metal oxide.

* * * * *